Aug. 23, 1966 S. P. RAGSDALE 3,268,830

OPERATIONAL AMPLIFIER GAIN CONTROL CIRCUIT
UTILIZING NON-LINEAR DEVICES

Filed Aug. 13, 1963

INVENTOR.
SAM P. RAGSDALE
BY
ATTORNEYS

United States Patent Office 3,268,830

Patented August 23, 1966

3,268,830

OPERATIONAL AMPLIFIER GAIN CONTROL CIRCUIT UTILIZING NON-LINEAR DEVICES

Sam P. Ragsdale, 1125 Potter Blvd., Tullahoma, Tenn.

Filed Aug. 13, 1963, Ser. No. 301,923

1 Claim. (Cl. 330—110)

This invention relates to amplifier circuitry, and particularly to an "operational" amplifier wherein the amplifier gain is limited in both the plus and minus directions. It is fundamental, of course, that the gain of an amplifier (of the character indicated) depends upon the ratio of the feedback impedance to the input impedance.

The present invention proposes to limit the feedback impedance by means of a non-linear diode network connected in parallel therewith, and by reason of such limiting effect upon the feedback impedance there is achieved a corresponding limitation of the overall gain characteristic of the amplifier circuitry, as a whole.

Figures 1, 2:
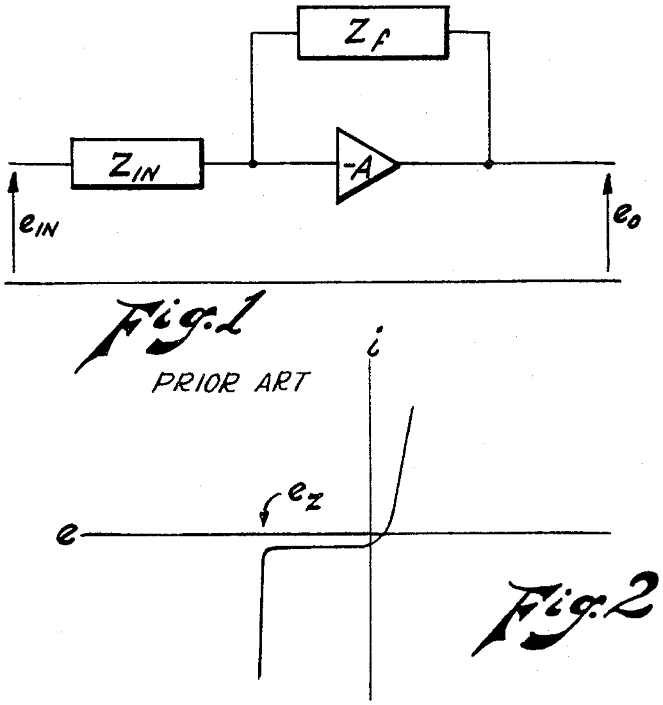
FIG. 1 shows the circuit components involved in a conventional operational amplifier.
FIG. 2 is a plot of the impedance characteristics of a diode.

By way of further explanation of the problem attacked by this invention, it may be observed that a conventional operational amplifier, as illustrated in FIG. 1, has a gain relationship that may be represented in the following equational form:

$$\frac{e_o}{e_{in}}=\frac{Z_f}{Z_{in}} \qquad (1)$$

The standard range of $e_o$ is $+100$ volts as has been determined by most manufacturers. Because of instability in computing or control circuits $e_{in}$ may reach such values that $e_o$ exceeds the 100 volts range. In this case, external circuits or devices being fed by the amplifier can be damaged. Also, sustained overvoltage operation can damage the amplifier. For these reasons it is often desired to limit the amplifier output so that the amplifier can never exceed a certain value. Methods have been developed which can limit the amplifier, but they nearly all depend on external reference voltages for their operation. Thus, the dependability of such a device is greatly reduced and the complexity and cost are increased.

*Background information—Zener diodes*

A Zener diode is a semiconductor device which has nonlinear conducting characteristics (see FIGURE 2). When voltage is applied to the diode in one direction, the diode conducts with an impedance fixed by the slope of the curve in the first quadrant of FIGURE 2. When the voltage polarity is reversed the diode is essentially an open circuit out to the breakdown voltage, $e_Z$. This voltage is called the Zener voltage and at this point the diode becomes essentially a short circuit. Diodes with especially designed characteristics about the Zener voltage are called "Zener diodes."

*Circuit description*

Figure 3:
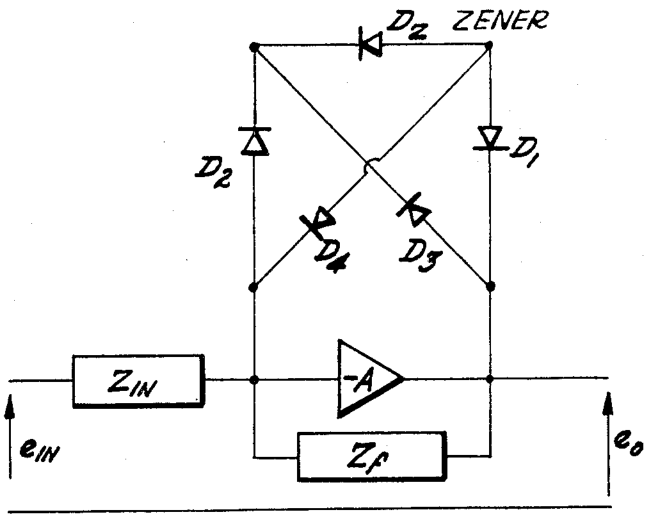
FIG. 3 shows the circuit of FIG. 1, with the invention incorporated therein.

The circuit of FIGURE 3 is a conventional operational amplifier circuit whose gain is governed by the relationship of Equation 1.

When the output voltage $e_o$, exceeds the Zener voltage, $eZ$, the Zener diode, $D_Z$, conducts in such a way as to reduce the effective feedback impedance, $Z_f$. The reduction is such as to reduce the gain of the amplifier to a very, very small number. Thus, with gains of near zero (.01 has been observed when $Z_{in}$=.1 megohm) the output can get no greater then $e_Z$ regardless of how $e_{in}$ varies.

*Operation*

In FIGURE 3 when $e_o$ starts positive the conducting diodes would be $D_3$ and $D_4$ if $D_Z$ were conducting. But this can only happen when $e_o$ reaches $e_Z$. Prior to $D_Z$ conducting the output voltage is:

$$e_o=\frac{Z_f}{Z_{in}}e_{in} \qquad (2)$$

When $e_o$ reaches the value $e_Z$, $D_Z$ begins to conduct and the combined impedance of $D_3$, $D_4$ and $D_Z$ in series and this in parallel with $Z_f$ makes the total feedback impedance very, very small. Since the gain is the ratio of feedback impedance to input impedance, the gain essentially drops to zero when the limit is reached. During this mode of operation $D_1$ and $D_2$ are open circuits.

The other condition of operation occurs when $e_o$ starts negative. This time the diodes $D_1$, $D_2$, and $D_Z$ conduct when $e_o$ reaches $e_Z$. $D_3$ and $D_4$ are open circuits. Again, when the Zener voltage is reached, the gain of the amplifier is limited at this value.

The diodes $D_1$, $D_2$, $D_3$ and $D_4$ are unidirectional conducting devices that are conductive in a forward direction only. The Zener diode $D_Z$ is a bidirectional conducting device which is conductive in a forward direction and, when the Zener voltage is reached, is also conductive in a reverse direction. Each of the diodes is illustrated in the drawings by an arrowhead and a bar drawn perpendicular to the direction in which the arrowhead points. Compared with a vacuum tube diode, the arrowhead is symbolic of an anode and the bar is symbolic of a cathode.

What I claim is:

In an operational amplifier an inverse feedback circuit comprising:

(a) a feedback impedance connected between the output and input of said amplifier, (b) first, second, third and fourth unidirectional conducting devices, (c) a Zener diode having a predetermined Zener voltage, (d) means for connecting the cathode of said first unidirectional conducting device and the anode of said second unidirectional conducting device, respectively, to one end and the other end of said feedback impedance, (e) means for connecting the anode and cathode of said Zener diode, respectively, to the anode and cathode of said first and second unidirectional conducting devices, (f) means for connecting the anode and cathode of said third unidirectional conducting device, respectively, to said one end of said feedback impedance and to the connection between said Zener diode and said second unidirectional conducting device, (g) and means for connecting the cathode and anode of said fourth unidirectional conducting device, respectively, to said other end of said feedback impedance and to the connection between said Zener diode and said first unidirectional conducting device, (h) whereby the network formed by said unidirectional conducting devices and said Zener diode makes the total feedback impedance of said inverse feedback circuit very small whenever a positive or negative voltage at the output of said amplifier reaches said predetermined Zener voltage.

(References on following page)

References Cited by the Examiner

UNITED STATES PATENTS

| | | | |
|---|---|---|---|
| 3,058,068 | 10/1962 | Hinrichs et al. | 330—110 X |
| 3,094,675 | 6/1963 | Ule | 330—110 |
| 3,153,152 | 10/1964 | Hoffman | 330—110 X |
| 3,166,720 | 1/1965 | Rosen et al. | 330—110 |
| 3,167,718 | 1/1965 | Davis et al. | 330—110 X |
| 3,210,690 | 10/1965 | Mokrytzki et al. | 331—113.1 |

FOREIGN PATENTS

| | | |
|---|---|---|
| 218,578 | 12/1961 | Austria. |

ROY LAKE, *Primary Examiner.*

R. P. KANANEN, N. KAUFMAN, *Assistant Examiners.*